United States Patent
Aowudomsuk et al.

(10) Patent No.: US 11,088,096 B2
(45) Date of Patent: Aug. 10, 2021

(54) TRANSISTOR OUTLINE HOUSING WITH HIGH RETURN LOSS

(71) Applicant: SCHOTT AG, Mainz (DE)

(72) Inventors: Artit Aowudomsuk, Bangkok (TH); Karsten Droegemueller, Eichenau (DE); Rudolf Jungwirth, Adikofen (DE); Michelle YanYan Fang, Landshut (DE)

(73) Assignee: SCHOTT AG, Mainz (DE)

( * ) Notice: Subject to any disclaimer, the term of this patent is extended or adjusted under 35 U.S.C. 154(b) by 0 days.

(21) Appl. No.: 16/154,989

(22) Filed: Oct. 9, 2018

(65) Prior Publication Data

US 2019/0109102 A1  Apr. 11, 2019

(30) Foreign Application Priority Data

Oct. 9, 2017 (DE) .......................... 102017123342.3

(51) Int. Cl.
| | |
|---|---|
| *H01L 23/66* | (2006.01) |
| *H05K 3/34* | (2006.01) |
| *H05K 1/18* | (2006.01) |
| *H01S 5/02212* | (2021.01) |
| *H05K 1/02* | (2006.01) |
| *H01L 23/00* | (2006.01) |

(52) U.S. Cl.
CPC .......... *H01L 23/66* (2013.01); *H01S 5/02212* (2013.01); *H05K 1/0243* (2013.01); *H05K 1/189* (2013.01); *H05K 3/3447* (2013.01); *H01L 24/48* (2013.01); *H01L 24/49* (2013.01); *H01L 2223/6611* (2013.01); *H01L 2224/04042* (2013.01); *H01L 2224/4823* (2013.01); *H01L 2224/48091* (2013.01); *H01L 2224/48145* (2013.01); *H01L 2224/48247* (2013.01); *H01L 2224/48249* (2013.01); *H01L 2224/48253* (2013.01); *H01L 2224/49175* (2013.01); *H01L 2924/3011* (2013.01); *H01L 2924/30111* (2013.01)

(58) Field of Classification Search
CPC ............ H01L 23/66; H01S 5/022; H05K 1/02
USPC .......................................... 257/E33.072, 432
See application file for complete search history.

(56) References Cited

U.S. PATENT DOCUMENTS

| | | | | |
|---|---|---|---|---|
| 4,816,791 A | * | 3/1989 | Carnahan | ................ H01P 1/047 333/238 |
| 4,951,011 A | | 8/1990 | Heckaman | |
| 2003/0178657 A1 | | 9/2003 | Nguyen | |
| 2003/0179536 A1 | * | 9/2003 | Stevenson | ................ H01G 4/35 361/302 |

(Continued)

FOREIGN PATENT DOCUMENTS

| | | |
|---|---|---|
| CN | 1452283 | 10/2003 |
| CN | 101668786 | 3/2010 |

(Continued)

*Primary Examiner* — Sheng-Bai Zhu
(74) *Attorney, Agent, or Firm* — Ohlandt, Greeley, Ruggiero & Perle, L.L.P.

(57) ABSTRACT

A transistor outline housing is provided that includes a header for an optoelectronic component. The header has electrical feedthroughs in the form of connection pins embedded in a potting compound. The header has a recess in which at least one of the connection pins in one of the feedthroughs extends out of the lower surface of the header.

26 Claims, 7 Drawing Sheets

(56) References Cited

U.S. PATENT DOCUMENTS

| | | | | |
|---|---|---|---|---|
| 2004/0184737 A1* | 9/2004 | Oono | | G02B 6/4201 |
| | | | | 385/52 |
| 2005/0121684 A1 | 6/2005 | Aruga | | |
| 2005/0276963 A1 | 12/2005 | Kim | | |
| 2006/0187454 A1* | 8/2006 | Shih | | H01L 31/0203 |
| | | | | 356/400 |
| 2008/0042227 A1* | 2/2008 | Asano | | H01L 27/14618 |
| | | | | 257/432 |
| 2009/0003003 A1* | 1/2009 | Park | | H01L 33/62 |
| | | | | 362/373 |
| 2009/0067469 A1* | 3/2009 | Sato | | H01S 5/02212 |
| | | | | 372/109 |
| 2010/0200890 A1* | 8/2010 | Tomiyama | | C08G 18/4202 |
| | | | | 257/100 |
| 2010/0326723 A1* | 12/2010 | McCusker | | A61N 1/3754 |
| | | | | 174/650 |
| 2014/0217570 A1* | 8/2014 | Hettier | | H01L 23/64 |
| | | | | 257/690 |
| 2016/0268237 A1* | 9/2016 | Lee | | H01L 25/0753 |

FOREIGN PATENT DOCUMENTS

| | | |
|---|---|---|
| CN | 105977246 | 9/2016 |
| DE | 10247315 | 4/2004 |
| DE | 102013114547 | 7/2014 |
| JP | H11186425 | 7/1999 |
| JP | 2004047830 | 2/2004 |
| JP | 2004253419 | 9/2004 |
| JP | 2005191088 | 7/2005 |
| JP | 2006506807 | 2/2006 |
| JP | 2011100785 | 5/2011 |
| JP | 2011108938 | 6/2011 |
| JP | 2011171649 | 9/2011 |
| JP | 2011176021 | 9/2011 |
| JP | 2012079804 | 4/2012 |
| JP | 2014232796 | 12/2014 |
| KR | 1020140042922 | 5/2006 |
| WO | 2004044637 | 5/2004 |

\* cited by examiner

Return loss:

Insertion loss:

TRANSISTOR OUTLINE HOUSING WITH HIGH RETURN LOSS

CROSS REFERENCE TO RELATED APPLICATIONS

This application claims benefit under 35 USC 119(a) of German Application No. 102017123342.3 filed Oct. 9, 2017, the entire contents of which are incorporated herein by reference.

BACKGROUND

1. Field of the Invention

The invention relates to a TO housing for an optoelectronic component. More particularly, the invention relates to a TO housing for a receiver or transmitter laser diode for data transmission. Furthermore, the invention relates to a method for producing a TO housing.

2. Description of Related Art

Transistor Outline (TO) housings for optoelectronic components have been known. Such housings are used for the laser diode of a transmitter or receiver, in particular in the field of the transmission of data signals.

Prior art housings in particular consist of a metal header which has glass feedthroughs embracing the connection pins that are used to transfer the data signal. The impedance of the signal path which extends from the connection point on a printed circuit board to the optoelectronic component has to be matched to the impedance of the optoelectronic component and/or to an electronic circuit driving, operating or powering the optoelectronic component. Depending on whether this is an optoelectronic component with one or two signal lines, impedances of 25, 50, or 100 Ω are common in practice.

The portion of a signal line located within a glass feedthrough can be regarded as a capacitance in the high frequency range, and a bonding wire which is used to connect the connection pin of the signal line to the optoelectronic component can be regarded as an inductance.

For matching the impedance of the signal path, published patent application DE 10 2013 114 547 A1 (Schott AG) proposes to provide the connection point of a printed circuit board (PCB) at a spacing from the lower surface of the header of the TO housing.

This spacing, due to which the connection pin is surrounded either by air or by a potting compound having a lower dielectric constant $\varepsilon_r$ than the potting compound of the feedthrough, creates an additional inductance on the connection side, which can be exploited to match the impedance of the signal path.

It has been found that at least in some applications it is difficult to exactly meet the desired spacing between the PCB and the lower surface of the TO housing.

SUMMARY

Given the above, the invention is based on the object to provide a TO housing with good impedance characteristics, in which the aforementioned drawbacks of the prior art are at least mitigated. More particularly, it is intended to further improve the impedance characteristics and to simplify the assembly of the TO housing on a printed circuit board.

The invention relates to a TO housing which comprises a header for an optoelectronic component. The header is in particular made of metal and provides a mounting area for an optoelectronic component.

Preferably, a cap with a window is placed on the header, in particular a cap with a window in the form of a lens. The window allows electromagnetic radiation that is used for data transmission to enter into the housing's interior and/or to exit from the housing.

The header has at least one electrical feedthrough which is in the form of at least one connection pin embedded in a potting compound. Preferably, the header has a plurality of feedthroughs, and at least one feedthrough serves as a signal conducting path.

Preferably, an inorganic potting compound is used, in particular glass.

The dielectric constant $\varepsilon_r$ ($=\varepsilon/\varepsilon_0$) of the potting compound is preferably less than 4.5, more preferably less than 4.0.

The potting compound serves both for physically bonding the connection pin to the header and for hermetically sealing the housing and for electrically insulating the connection pin from the header.

According to the invention, the header has a recess, and the connection pins extend out of the TO housing within the range of the recess.

A recess is understood to mean a limited area which does not extend over the entire surface of the header and within which the thickness of the preferably plate-shaped header is reduced.

The recess is preferably provided in the lower surface of the header.

According to another embodiment, a recess may also be provided in the upper surface of the header, i.e. inside the housing. Also, opposing recesses may be provided both in the upper and lower surfaces.

At least one of the connection pins in one of the feedthroughs extends out of the lower surface of the header within the recess. The feedthrough, which consists of potting compound and the portion of a connection pin embedded therein, preferably terminates at the bottom of the recess.

Thus, due to the recess, the exit point of the feedthrough is spaced from the adjacent lower surface of the header.

A printed circuit board can now be mounted and connected directly adjoining the lower surface of the header. With a recess provided in the lower surface, a connection point spaced from the feedthrough is resulting, which causes an additional inductance below the feedthrough and thus an improved impedance characteristic.

For this purpose, the recess defines a cavity or may as well be filled with a material, in particular with a polymeric material which has a lower dielectric constant $\varepsilon_r$ than the potting compound of the feedthrough, in particular a material with a dielectric constant $\varepsilon_r$ which is smaller by at least 1.0 than the dielectric constant of the potting compound.

Preferably, the header of the housing consists of a single layer, in particular of one piece. In particular, the recess is embossed in the header. In this way, the recess can be provided particularly easily.

According to another embodiment, the header consists of multiple layers, and a lowermost housing layer has a through-hole. In this embodiment, the lower surface of an upper housing layer forms the bottom of the recess.

In a further embodiment of the invention, two and in particular exactly two connection pins extend out of the lower surface in a single recess. This embodiment of the invention may in particular be used for a TO housing for an optoelectronic component for symmetrical, optionally symmetrical differential signal transfer (differential signaling).

It will be understood, however, that it is as well conceivable for the TO housing to have three or more feedthroughs for a signal line, and/or that at least two connection pins for a respective signal line sit in a respective single recess, in particular in a circular cylindrical recess.

Preferably, the TO housing additionally comprises further connection pins which are not used to connect a signal line. The feedthroughs for these connection pins are preferably not arranged in a recess. Rather, connection pins that are used for power supply and/or for controlling the optoelectronic component are arranged in a potting compound that extends as far as to the lower surface of the header.

For a feedthrough of a single connection pin, the recess is preferably substantially circular as seen in a plan view, in particular the recess has the shape of a circular cylinder. In case of a shape slightly differing from a circular shape, the ratio of the largest to the smallest diameters is in particular not more than 1.2.

For a feedthrough with two connection pins, the recess preferably has substantially the shape of an elongated hole. The feedthrough may as well have an oval shape.

The depth of the at least one recess extending from at least one side of the header, or in the case of two recesses the total depth of the two recesses, is preferably 1 to 80% of the thickness of the header, preferably 4 to 65%, most preferably 15 to 30%. As described above, the recess may extend from one side or from both sides, and in the case of recesses on both sides the respective depths may be different from each other.

According to a preferred embodiment, the recess for matching the impedance characteristic occupies in particular 20 to 50%, preferably 35 to 45% of the height of the header, at least in an area of the header adjacent to the recess. Thus, the depth of the recess is 20 to 50% of the thickness of the header in the region of the recess.

Preferably, a section of a conductor trace located in the recess and therefore extending from the lower end of the feedthrough to the connection point on the printed circuit board has an impedance that is higher by 1.2 to 4 times, preferably by 1.6 to 2.7 times than that of a conductor trace section located within the electrical feedthrough and extending from the lower to the upper surface of the header and therefore being surrounded by the potting compound.

In the context of the invention, impedance is understood to mean the characteristic wave impedance of a line.

The ratio of voltage and current in a propagating wave is the characteristic wave impedance of a line. The characteristic wave impedance is a characteristic of a line. The characteristic wave impedance results from the cross-sectional dimensions and material constants. Therefore, the characteristic wave impedance is a line constant. The characteristic wave impedance is independent of location (if the line does not vary), and for high frequencies it is independent of frequency, in particular for frequencies above 5 GHz that are relevant here.

With the invention it was possible, at 20 GHz, to achieve a return loss of more than 12 dB, preferably more than 15 dB.

In particular, it has been possible to provide a TO housing in which the return loss forms a plateau, in particular within a range from 10 to 20 GHz, where the return loss is between 10 and 35 dB, preferably between 15 and 20 dB. With an appropriate design of the geometry and/or the materials of the housing it is possible to achieve a shift and/or broadening of the interval at least towards higher frequencies.

Preferably, in a range from 10 to 20 GHz, the return loss of a signal path of the housing ranges between plus/minus 2.5 dB, i.e. within a window of 5 dB.

Insertion loss is preferably less than 0.5 dB within a range from 10 to 20 GHz.

If the TO housing is equipped with an optoelectronic component and connected to a conductor trace, in particular to a flexible conductor trace, the impedance of the signal path is in particular between 10 and 150Ω, preferably between 40 and 60Ω, or between 20 and 30Ω, or between 90 and 110 Ω2.

If the TO housing is connected to a PCB with an electronic circuit, the electronic circuit on the PCB preferably has the impedance of the signal path plus/minus 5Ω.

Hence, the impedance of the electronic circuit corresponds at least approximately to the impedance of the signal path. The impedance of the electronic circuit and the impedance of the optoelectronic component determine the configuration of the TO housing with regard to the impedance of the signal conductor path and thus in particular with regard to the configuration of the recess.

The signal path, in this case, extends from a connection point on the conductor trace to a connection point on the optoelectronic component. Consequently, the signal path consists of an inductance within the range of the recess, a capacitance within the range of the feedthrough, and an inductance defined by the bonding wire.

The recess preferably has a width or a diameter that is from 1.0 to 4.0 times, preferably from 1.0 to 3.0 times, and most preferably from 1.2 to 2.5 times the size of the diameter or width of the electrical feedthrough defined by the connection pin and the potting compound.

Preferably, the recess has a width or a diameter which is from 1.5 to 5.0 times, preferably from 2.0 to 3.0 times the size of the diameter of the portion of the connection pin located within the electrical feedthrough. The depth of the recess is preferably from 0.1 to 1.5 mm, most preferably from 0.4 to 0.8 mm. In the case of a recess with a non-flat bottom, depth is understood to mean the maximum depth. Preferably, however, the bottom of the recess is flat.

The TO housing according to the invention comprises a header which is preferably formed by stamping, and the recess is formed by embossing, in particular during stamping.

Thus, the header of the TO housing is easy to manufacture. Depending on the application, headers can be made with recesses of different depths in a simple way. The impedance of the signal path can be easily adapted to the particular application through the geometry of the recess, in particular the depth thereof.

BRIEF DESCRIPTION OF THE DRAWINGS

The subject-matter of the invention will now be explained in more detail by way of exemplary embodiments with reference to the drawings of FIGS. 1 to 9.

DETAILED DESCRIPTION

Figure 1:
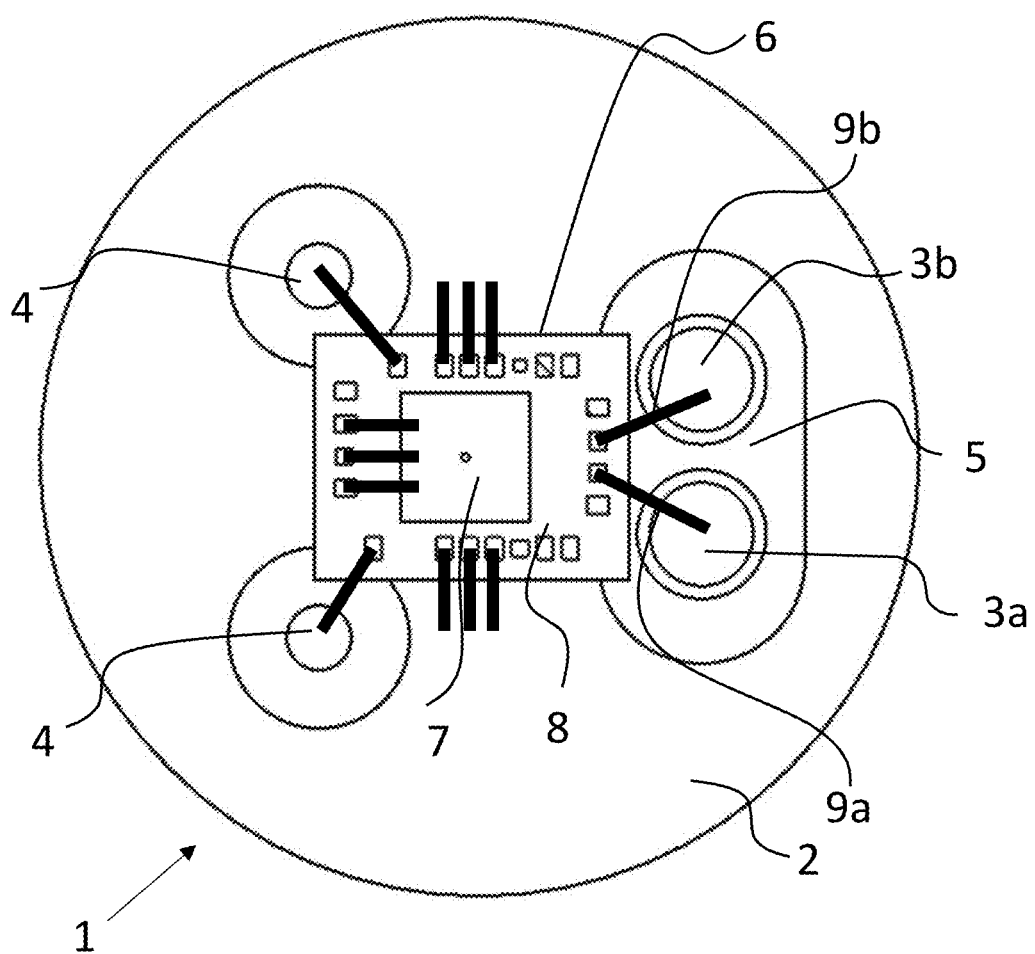
FIG. 1 is a plan view of the upper side of the header of an exemplary embodiment of a TO housing according to the invention, which is already equipped with an optoelectronic component.

FIG. 1 shows a plan view of the upper side of the header 2 of a TO housing 1 according to the invention. The complete TO housing 1 may comprise a cap with a window (not shown) fitted to this header 2.

Header 2 has a circular cylindrical shape in this exemplary embodiment and may in particular consist of a stamped metal part.

More particularly, the header 2 may consist of steel. Furthermore, the header may have a coating, in particular a gold-containing coating.

The header 2 provides a mounting area for an optoelectronic component 6.

The optoelectronic component 6 of this exemplary embodiment comprises a photodiode 7 which is mounted on an amplifier 8.

In this exemplary embodiment, the TO housing 1 comprises connection pins 3a and 3b in the form of signal conducting connection pins for the input and output signals.

Connection pins 3a and 3b are embedded in a potting compound 5, in particular a potting compound 5 made of glass, thereby defining an electrical feedthrough.

Bonding wires 9a, 9b are used to connect the connection pins 3a and 3b to the optoelectronic component 6 within the TO housing.

It will be understood that such a TO housing 1 usually comprises further connection pins 4 which may also be embedded in a potting compound, in particular a glass potting compound.

In contrast to connection pins 3a and 3b, however, connection pins 4 do not serve for transmitting input or output signals, but are used for power supply or as a control line for the optoelectronic component 6. Therefore, less stringent requirements on the impedance characteristics are usually imposed on the signal paths through connection pins 4.

Figure 2:
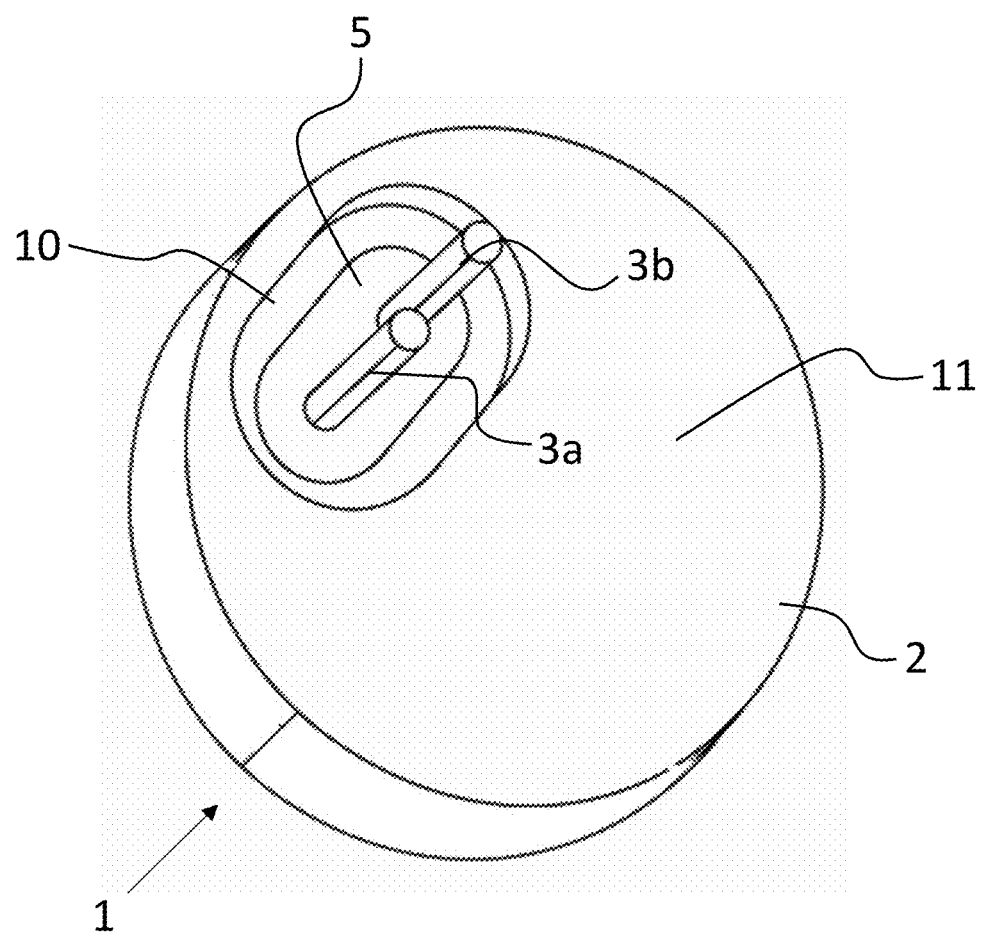
FIG. 2 is a perspective view of the lower surface of the TO housing illustrated in FIG. 1.

FIG. 2 shows the TO housing 1 illustrated in FIG. 1 in a perspective view of the lower surface 11. It can be seen that the feedthrough with connection pins 3a and 3b, which comprises the potting compound 5 and the connection pins 3a, 3b is arranged in a recess 10. In this exemplary embodiment, two connection pins 3a, 3b are arranged in a single feedthrough.

Recess 10 has the shape of an elongated hole, and as a result thereof the connection pins 3a, 3b exit from the header 2 not at the level of lower surface 11 but spaced therefrom, namely approximately at the level of the bottom of recess 10.

The further connection pins that do not serve as a signal line (4 in FIG. 1) are not shown in this view, for the sake of clarity.

The header 2 is preferably formed in one piece, and the recess 10 is in particular embossed.

Figure 3:
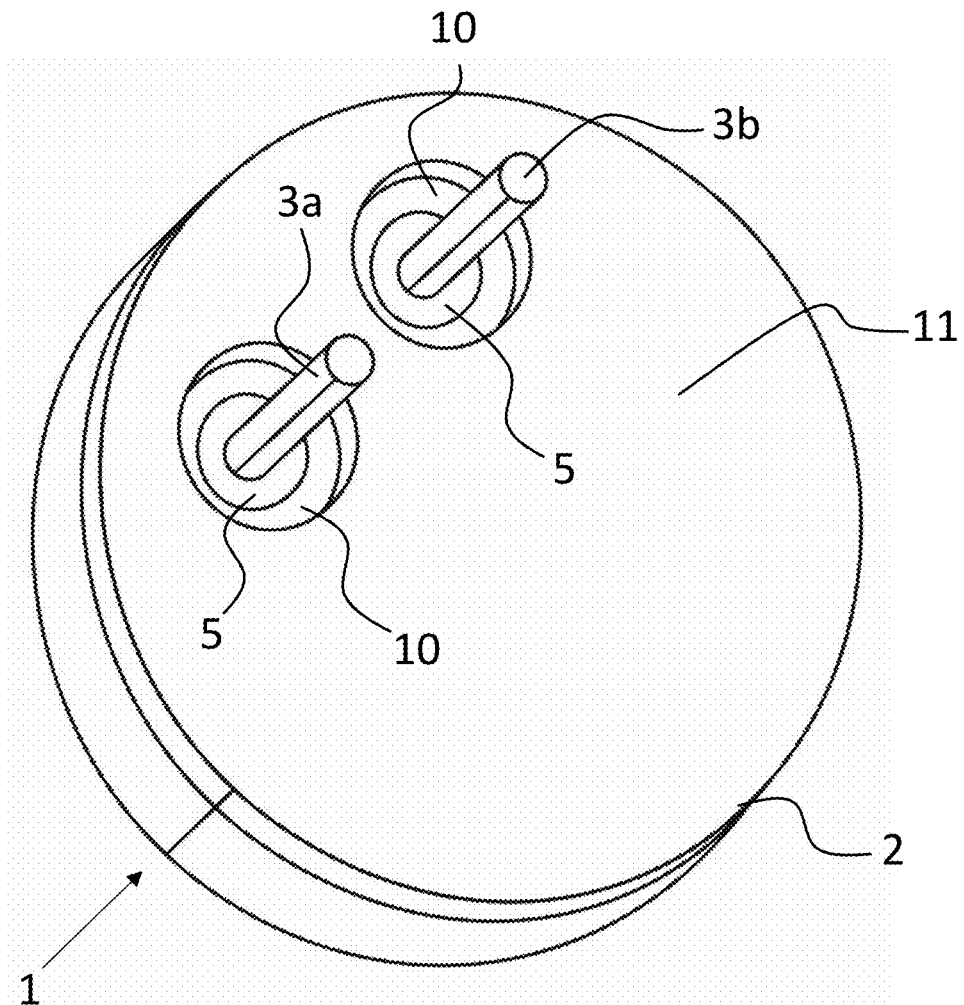
FIG. 3 shows, also in a perspective view, the lower surface of an alternative embodiment of a TO housing, in which two separate connection pins are arranged each in a respective feedthrough.

FIG. 3 shows an alternative embodiment of a TO housing 1 as compared to FIGS. 1 and 2. In this embodiment, a respective single connection pin 3a, 3b is arranged in a respective feedthrough. Thus, each feedthrough consists of a single connection pin 3a, 3b and a potting compound 5 in which the connection pin 3a, 3b is embedded.

In this exemplary embodiment, two separate recesses 10 are provided so that the feedthrough of each connection pin 3a, 3b is arranged in a separate recess 10.

The respective recess 10 therefore has a circular cylindrical shape in this embodiment.

In the exemplary embodiment as illustrated here, the header 2 consists of two layers. However, it will be appreciated that the embodiment with two separate feedthroughs as illustrated in FIG. 3 may as well consist of one layer.

Otherwise, the exemplary embodiment illustrated in FIG. 3 may be similar to the exemplary embodiment illustrated above in FIGS. 1 and 2.

Figure 4:
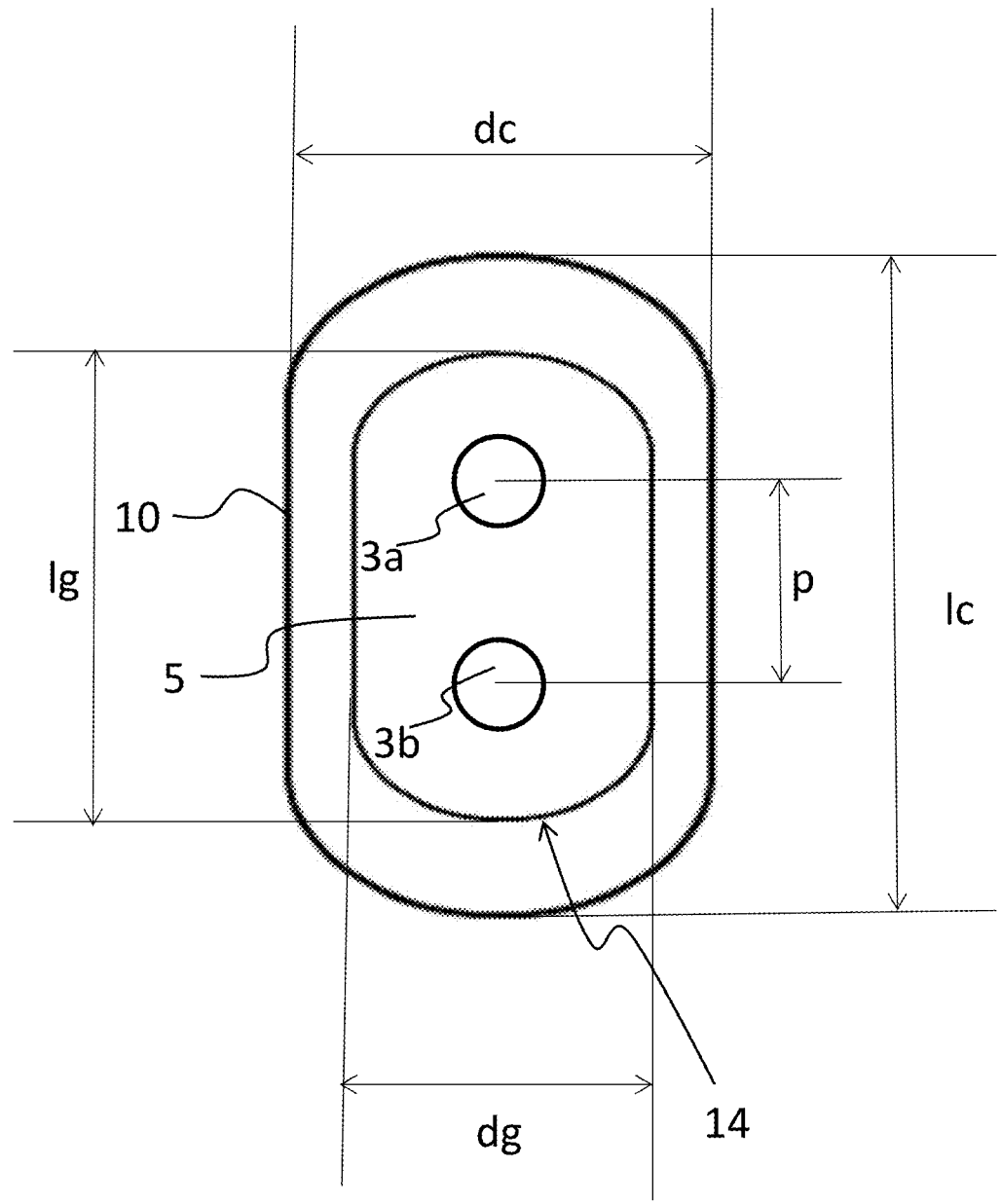
FIG. 4 is a detailed view of a recess together with a feedthrough with at least one connection pin, which serves to explained in greater detail the dimensioning of the feedthrough and of the recess.

Referring to FIG. 4, the preferred dimensioning of the recess and the feedthrough will be explained in more detail by way of an exemplary embodiment which, however, applies to all embodiments of the invention and not just to the embodiments illustrated in the preceding drawings.

In the case that two connection pins 3a, 3b are arranged in a feedthrough 14, as shown herein, the recess 10 has a length $L_c$ from 1 to 5 mm, preferably from 1.2 to 2.75 mm. Furthermore, the recess preferably has a width $d_c$ from 0.3 to 3 mm, more preferably from 0.7 to 1.8 mm.

In the case of a circular cylindrical recess 10 for a feedthrough with a single connection pin (not shown here), the recess has a diameter $d_c$ from 0.3 to 3 mm, preferably from 0.7 to 1.8 mm.

The recess 10 preferably has a depth from 0.1 to 1.5 mm, more preferably from 0.4 to 0.8 mm.

The potting compound 5 may have a width, or in the case of a circular cylindrical configuration for a single connection pin a diameter, $d_g$, from 0.7 to 1.4 mm, and/or a length $l_g$ from 1.45 to 2.35 mm.

In the case of a feedthrough 14 with two spaced apart connection pins 3a, 3b, the spacing p may range between 0.5 and 0.95 mm.

The diameter of an individual connection pin 3a, 3b in the feedthrough 14 is preferably from 0.2 to 0.5 mm.

The connection pins 3a, 3b may have a thickened head or may be formed so as to extend along an angle inside the housing, which may in particular serve to reduce the length of the bonding wires (9a, 9b in FIG. 1).

Preferably, the recess has a width that is from 1.2 to 1.5 times, preferably from 1.5 to 2 times the size of the feedthrough 14, or a diameter that is from 1.2 to 5 times, preferably from 1.5 to 2 times the size of the feedthrough 14.

Figure 5:
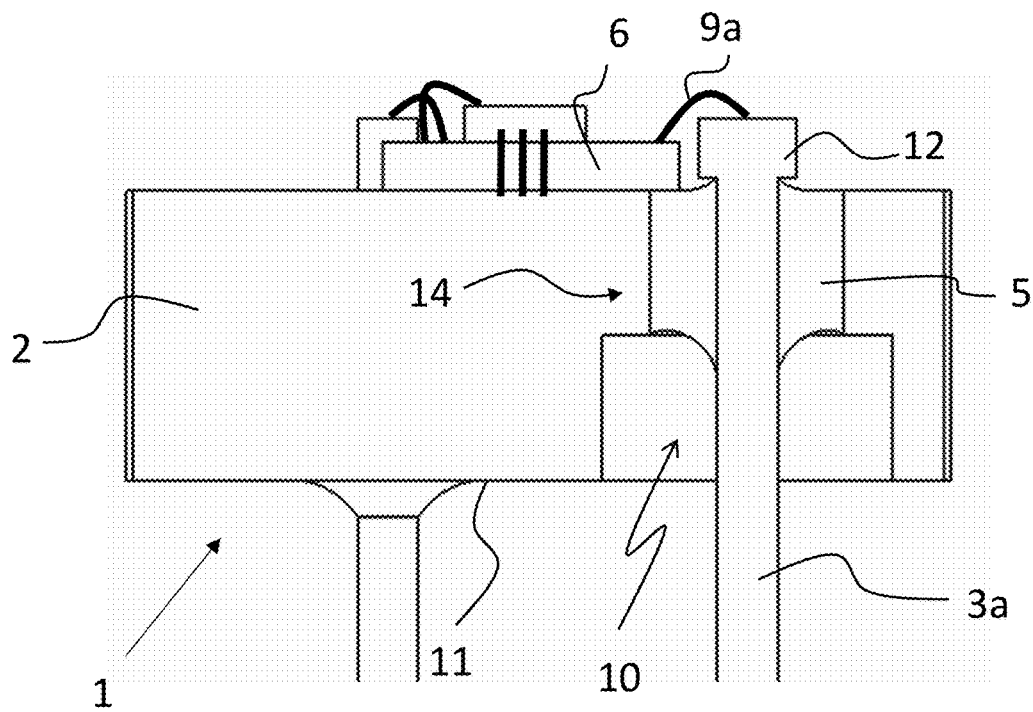
FIG. 5 is a schematic side view of a TO housing according to the invention.

FIG. 5 shows a schematic sectional view of the TO housing 1 illustrated in FIGS. 1 and 2.

It can be seen that the feedthrough 14 defined by the potting compound 5 and the portion of the connection pin 3a arranged in the potting compound 5 extends through the header 2.

In this exemplary embodiment, the connection pin 3a (preferably also the connection pin 3b) has a thickened head 12. This allows to reduce the length of the bonding wire 9a which is used to connect the connection pin 3a to the optoelectronic component 6.

Below the feedthrough, the recess 10 is provided, which causes the potting compound 5 and thus the feedthrough to end above the lower surface 11 of header 2, in particular approximately at the level of the bottom of the recess 10.

Figure 6:
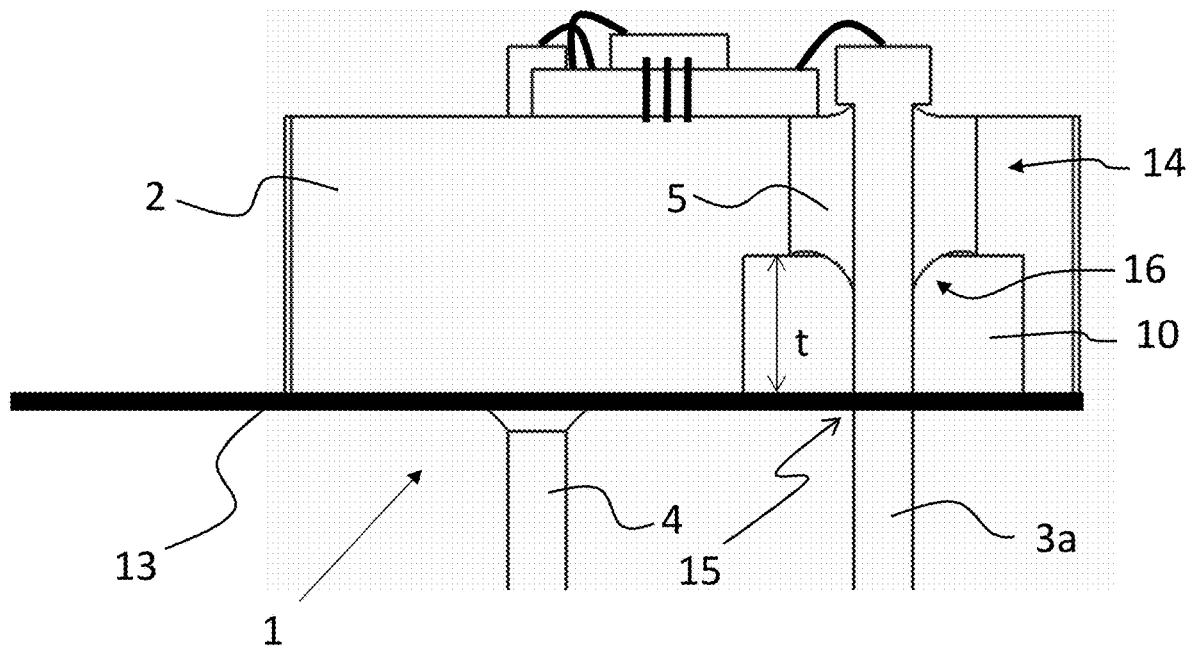
FIG. 6 shows how the TO housing illustrated in FIG. 5 is connected to a PCB.

FIG. 6 shows how a printed circuit board 13, in particular a flexible printed circuit board 13, is now connected to the TO housing 1. Printed circuit board 13 is applied to the lower surface (11 in FIG. 5) of the header 2, that means at least its upper surface lies at the level of the lower surface of header 2.

Due to the recess 10, the connection area 15 between printed circuit board 13 and connection pin 3a is spaced apart from the feedthrough 14.

The spacing between the connection area 15 and the feedthrough 14 corresponds substantially to the depth t of the recess 10.

As the recess 10 is either provided as a cavity or is filled with a material having a lower dielectric constant than the potting compound 5, an inductance is resulting.

Connection of the printed circuit board 13 and ensuring a predefined spacing between the connection area 15 and the feedthrough 14 is easily feasible.

For connection, the contact trace of the printed circuit board 13 can be perforated. Then, connection pins 3a, 3b are inserted into the respective hole until the printed circuit board 13 abuts on the lower surface of the header 2, and the connection area 15 can be easily connected by soldering.

The other connection pins 4 can be contacted in the same manner, but without there being a recess below the feedthrough of connection pins 4, so that the printed circuit board 13 will directly adjoin the respective feedthrough of one of these connection pins 4.

It can also be seen that in the exit area 16 of the feedthrough 14, the potting compound 5 may pull up on the connection pin 3a during melting. In this case, the connection pin 3a will be wrapped by a portion of potting compound 5 above the bottom of the recess 10 as well. This can optionally be compensated for by a correspondingly deeper recess 10.

Figure 7:
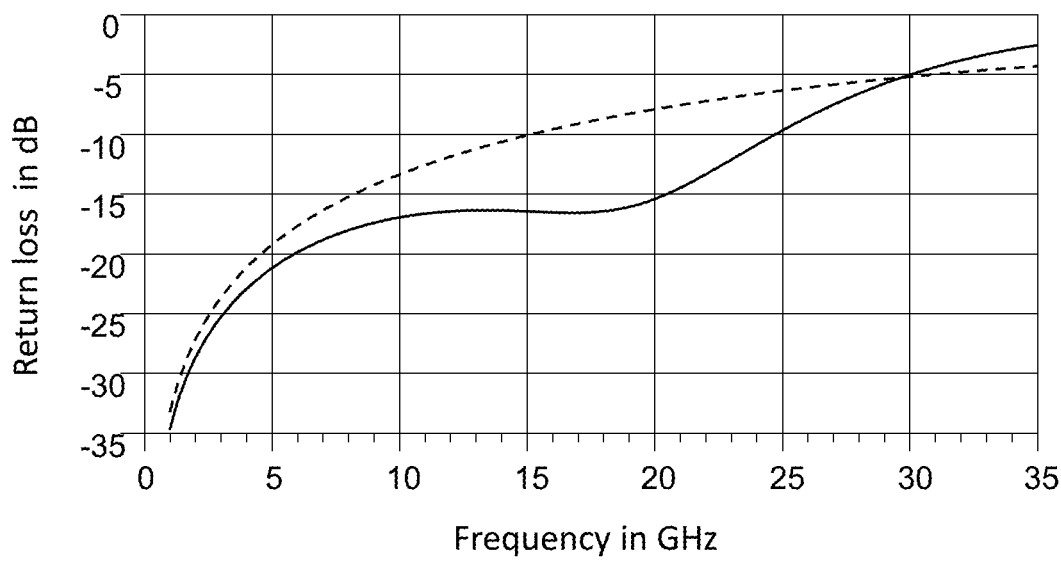
FIG. 7 is a graph showing the return loss.

The graph in the view of FIG. 7 shows the return loss, in dB, of an exemplary embodiment of a TO housing according to the invention (solid line) in comparison to a TO housing without a recess (dashed line).

The frequency in GHz is represented on the x-axis, and the return loss in dB on the y-axis.

Return loss is the logarithmic ratio between the reflected signal and the input signal. The greater the return loss, the better the impedance matching of the components. For example, if the return loss is −3 dB, only 50% of the signal will be transmitted, while at −10 dB still 90%.

As can be seen, a plateau is formed in a frequency range from 10 to 20 GHz, and at 10 GHz the return loss is already about 5 dB higher.

In the TO housing without recess, the return loss continuously increases, also in the range from 10 to 20 GHz preferably intended for applications.

At 20 GHz, it was possible with the inventive design of the TO housing to achieve a return loss that was higher by more than 5 dB.

In particular, it was possible to provide a TO housing in which the return loss is between −15 and −20 dB within the entire range between 10 and 20 GHz.

Above 20 GHz, the return loss decreases continuously also in the TO housing of the invention, and above 30 GHz it is even lower than in the TO housing without a recess. Therefore, the TO housing of the invention is particularly suitable for applications above 10 GHz but below 20 GHz.

Figure 8:
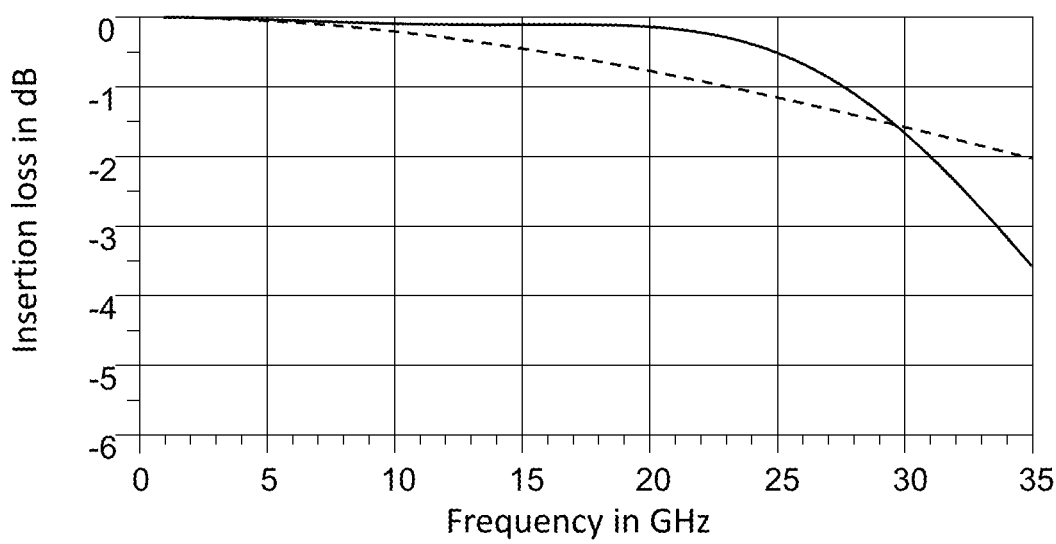
FIG. 8 is a graph showing the insertion loss of a TO housing according to the invention, plotted as a function of frequency in each case.

FIG. 8 shows, in a similar view, the insertion loss of a TO housing according to the invention (solid line) in comparison with a TO housing without recess (dashed line).

It can be seen that the TO housing of the invention also exhibits improved insertion loss. Insertion loss is lower within the entire frequency range between 10 and 20 GHz.

It goes without saying that a highest possible return loss and a low insertion loss is desired to be achieved in the frequency range used for the respective application.

It is of particular advantage that a nearly constant return loss is achieved by the invention in a wide frequency range.

Figure 9:
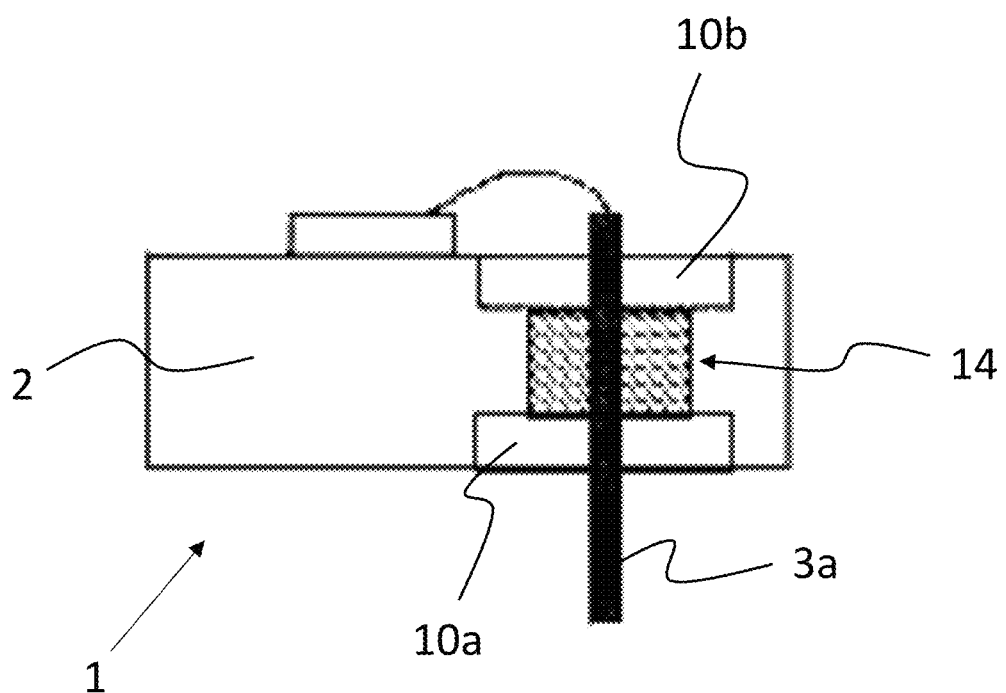
FIG. 9 is a schematic sectional view of a further embodiment of a TO housing, in which a recess is also provided in the upper surface.

FIG. 9 is a schematic sectional view of a further embodiment of a TO housing 1 in which the header 2 has a respective recess 10a, 10b both on the upper side and on the lower side.

The connection pin 3a extends through the header 2 in the feedthrough 14 within recesses 10a, 10b.

Otherwise, the TO housing may correspond to the previously described TO housing.

In another embodiment, not shown, a recess may as well only be provided on an upper side.

List of Reference Numerals

1 TO housing
2 Header
3a, 3b Connection pin
4 Connection pin
5 Potting compound
6 Optoelectronic component
7 Photodiode
8 Amplifier
9a, 9b Bonding wire
10, 10a, 10 Recess
11 Lower surface
12 Head
13 Printed circuit board
14 Feedthrough
15 Connection area
16 Exit area

What is claimed is:

1. A transistor outline housing, comprising:
   a header configured for an optoelectronic component having signal frequency above 5 GHz, the header having an upper surface and a lower surface, the header having at least one electrical feedthrough in the form of a connection pin embedded in a potting compound, the header having a recess, the connection pin exiting the potting compound in the recess and spaced from the lower surface and extends at least to the upper surface and out of the lower surface of the header; and
   a conductor trace having a section in the recess with an impedance that is higher by 1.2 to 4 times than that of a section of the conductor trace in the at least one electrical feedthrough.

2. The transistor outline housing of claim 1, wherein the potting compound is glass.

3. The transistor outline housing of claim 1, wherein the recess is in the lower surface of the header.

4. The transistor outline housing of claim 1, wherein the connection pin comprises two pins extending out of the lower surface in the recess.

5. The transistor outline housing of claim 1, wherein the recess is filled with a material having a lower dielectric constant than the potting compound.

6. The transistor outline of claim 1, wherein the recess has a cross-sectional shape that is circular or an elongated hole.

7. The transistor outline housing of claim 1, wherein the recess has a length from 1 to 5 mm, a width or diameter from 0.3 to 3 mm, and a depth from 0.1 to 1.5 mm.

8. The transistor outline housing of claim 1, wherein the feedthrough has a width or a diameter from 0.7 to 1.4 mm or a length from 1.45 to 2.35 mm.

9. The transistor outline housing of claim 1, wherein two connection pins are arranged in a feedthrough have a spacing between 0.5 and 0.95 mm.

10. The transistor outline housing of claim 1, wherein the at least one connection pin in the feedthrough has a diameter from 0.2 to 0.5 mm.

11. The transistor outline housing of claim 1, wherein the recess has a width or diameter from 1.2 to 5 times that of the feedthrough.

12. The transistor outline housing of claim 1, wherein the recess occupies 20 to 50% of a height of the header at least in an area adjacent to the recess.

13. The transistor outline housing of claim 1, further comprising an optoelectronic component connected to the conductor trace, a signal path extending between a connection point on the conductor trace and a connection point on the optoelectronic component having an impedance of in a range selected from a group consisting of between 40 and 60Ω, between 20 and 30Ω, and between 90 and 110 Ω.

14. The transistor outline housing of claim 1, wherein the connection pins are connected to a printed circuit board, wherein at least one connection point between the printed circuit board and the connection pin is located at a level of the lower surface of the header.

15. The transistor outline housing of claim 14, wherein the printed circuit board is a flexible printed circuit board.

16. The transistor outline housing of claim 1, wherein the recess has a width or a diameter that is from 1.0 to 4.0 times a diameter of the electrical feedthrough.

17. The transistor outline housing of claim 1, wherein the recess has a width or a diameter that is from 1.5 to 5.0 times a diameter of a portion of the connection pin located within the electrical feedthrough.

18. The transistor outline housing of claim 1, wherein the header consists of a single layer.

19. The transistor outline housing of claim 1, further comprising a signal path that exhibits a return loss, wherein the return loss either forms a plateau in a range from 10 to 20 GHz, within which the return loss is between 10 and 35 dB, or ranges between plus/minus 2.5 dB in a range from 10 to 20 GHz.

20. A transistor outline housing, comprising:
a header configured for an optoelectronic component having signal frequency above 5 GHz, the header having a circular cylindrical stamped metal part, the header having an upper surface and a lower surface;
a feedthrough in the header between the upper and lower surfaces;
a recess in the header around the feedthrough at the lower surface;
a connection pin configured to transmit input or output signals to the upper and lower surfaces;
a potting compound embedding the connection pin in the feedthrough, the connection pin exiting the potting compound in the recess and spaced from the lower surface; and
a conductor trace having a section in the recess with an impedance that is higher by 1.2 to 4 times than that of a section of the conductor trace in the at least one electrical feedthrough.

21. The transistor outline housing of claim 20, wherein the header comprises a first housing layer having the feedthrough and a second housing layer forming the recess.

22. The transistor outline housing of claim 20, further comprising one or more power connection pins embedded in a second feedthrough in the header.

23. The transistor outline housing of claim 20, further comprising a printed circuit board on the lower surface with a spacing between the printed circuit board and the potting compound.

24. The transistor outline housing of claim 23, wherein the spacing is filled with air.

25. The transistor outline housing of claim 23, wherein the spacing is filled with a material having a lower dielectric constant than the potting compound.

26. The transistor outline housing of claim 23, wherein the connection pin extends out of the upper surface.

* * * * *